US010444619B2

(12) United States Patent
Lee et al.

(10) Patent No.: US 10,444,619 B2
(45) Date of Patent: Oct. 15, 2019

(54) MASK BLANK AND PHASE SHIFT MASK USING SAME

(71) Applicant: Samsung Electronics Co., Ltd., Suwon-si (KR)

(72) Inventors: Hye Kyoung Lee, Incheon (KR); Il Yong Jang, Yongin-si (KR); Hwan Seok Seo, Suwon-si (KR); Byung Gook Kim, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 147 days.

(21) Appl. No.: 15/641,454

(22) Filed: Jul. 5, 2017

(65) Prior Publication Data

US 2018/0033612 A1  Feb. 1, 2018

(30) Foreign Application Priority Data

Jul. 26, 2016  (KR) .......................... 10-2016-0094809

(51) Int. Cl.

| *G03F 1/32* | (2012.01) |
| *G03F 1/00* | (2012.01) |
| *G03F 1/58* | (2012.01) |
| *G03F 7/00* | (2006.01) |
| *H01L 21/027* | (2006.01) |
| *H01L 21/033* | (2006.01) |

(52) U.S. Cl.
CPC .............. *G03F 1/32* (2013.01); *G03F 1/0069* (2013.01); *G03F 1/58* (2013.01); *G03F 7/001* (2013.01); *H01L 21/0274* (2013.01); *H01L 21/0337* (2013.01)

(58) Field of Classification Search
CPC ................. G03F 1/32; G03F 1/50; G03F 1/58

USPC ............................................................ 430/5
See application file for complete search history.

(56) References Cited

U.S. PATENT DOCUMENTS

| 7,829,471 | B2 | 11/2010 | Kumar |
| 9,188,852 | B2 * | 11/2015 | Fukaya ..................... G03F 1/30 |
| 9,494,852 | B2 * | 11/2016 | Okubo ....................... G03F 1/26 |
| 9,952,429 | B2 * | 4/2018 | Ekambaram ....... G02B 27/0101 |
| 2006/0019176 | A1 | 1/2006 | Kim et al. |
| 2010/0255411 | A1 | 10/2010 | Sato et al. |
| 2011/0159411 | A1 | 6/2011 | Olson et al. |
| 2013/0109112 | A1 | 5/2013 | Grimbergen |
| 2013/0309601 | A1 | 11/2013 | Fukaya et al. |
| 2015/0198873 | A1 | 7/2015 | Okubo et al. |

FOREIGN PATENT DOCUMENTS

| JP | 4930736 | 5/2012 |
| KR | 10-0594289 | 6/2006 |
| KR | 10-0947166 B1 | 3/2010 |
| KR | 10-2012-0087186 | 8/2012 |
| KR | 10-2015-0034766 | 4/2015 |

* cited by examiner

*Primary Examiner* — Christopher G Young
(74) *Attorney, Agent, or Firm* — Muir Patent Law, PLLC

(57) ABSTRACT

A mask blank includes: a light transmitting substrate; a first layer disposed on the light transmitting substrate, and including a chromium compound that contains chromium and at least one element selected from oxygen, nitrogen, and carbon; and a second layer disposed on the first layer as an outermost layer from among the first and second layers, and including a silicon compound that contains silicon and at least one element selected from oxygen, nitrogen, and carbon, an alloy of a transition metal and silicon, or a transition metal and silicon compound that contains a transition metal, silicon, and at least one element selected from oxygen, nitrogen, and carbon. The thickness of the first layer is 45 nm or less, and the thickness of the second layer is 5 nm or greater. An optical density of a stack composed of the first layer and the second layer is 3 or greater.

7 Claims, 8 Drawing Sheets

MASK BLANK AND PHASE SHIFT MASK USING SAME

CROSS-REFERENCE TO RELATED APPLICATION

This application claims the benefit of priority under 35 U.S.C. § 119 to Korean Patent Application No. 10-2016-0094809, filed on Jul. 26, 2016, in the Korean Intellectual Property Office, the disclosure of which is incorporated herein by reference in its entirety.

BACKGROUND

1. Field

The present disclosure relates to an optical device and a light source module having the same.

2. Description of Related Art

A photolithography process forms a pattern by irradiating a photoresist layer, coated on a substrate, with light, and is widely used in various fields, such as a flat panel display, a circuit board, and an integrated circuit.

Recently, technology for a photolithography process has been developed according to demand for a semiconductor device having a very fine pattern. For example, a mask used in photolithography may have an important influence on the quality of a fine pattern.

SUMMARY

An aspect of an example embodiment may provide a mask blank capable of guaranteeing a high degree of light blocking property and accuracy of a pattern thereof while being formed by using a simplified mask forming process.

An aspect of an example embodiment may provide a phase shift mask having a high degree of light blocking property and accuracy of a pattern thereof while being manufactured by using a simplified mask forming process.

According to an example embodiment, a mask blank may include: a light transmitting substrate; a first layer disposed on the light transmitting substrate, and including a chromium compound that contains chromium and at least one element selected from oxygen, nitrogen, and carbon; and a second layer disposed on the first layer as an outermost layer from among the first and second layers, and including a silicon compound that contains silicon and at least one element selected from oxygen, nitrogen, and carbon, an alloy of a transition metal and silicon, or a transition metal and silicon compound that contains a transition metal, silicon, and at least one element selected from oxygen, nitrogen, and carbon, in which an optical density of a stack composed of the first layer and the second layer are 3 or greater.

According to an aspect of an example embodiment, a method for a phase shift mask may include: providing a light transmitting substrate having a light transmitting region that has an etched area having a predefined depth and a non-etched area and a light blocking region; and providing a light blocking portion having a first layer disposed on the light blocking region of the light transmitting substrate, and a second layer disposed on the first layer, and provided as an outermost layer among the first layer and second layer, wherein the first layer comprises a chromium compound that contains chromium and at least one selected from oxygen, nitrogen, and carbon, and the second layer comprises a silicon compound that contains silicon and at least one selected from oxygen, nitrogen, and carbon, an alloy of a transition metal and silicon, or a transition metal and silicon compound that contains a transition metal, silicon, and at least one selected from oxygen, nitrogen, and carbon, and wherein an optical density of the light blocking portion is 3 or greater.

According to an aspect of an example embodiment, a method for a phase shift mask may include: providing a light transmitting substrate having a light transmitting region and a light blocking region, wherein the light transmitting region has an etched area having a predefined depth and a non-etched area; providing a first layer disposed on the light blocking region of the light transmitting substrate, and including a material that contains at least chromium; and providing a second layer disposed on the first layer as an outermost layer among the first and second layer, and including a compound that contains a transition metal and silicon, wherein when the light transmitting substrate is dry etched using a fluorine-based gas, an etching selectivity of the light transmitting substrate with respect to the second layer is equal to or greater than a ratio of the predefined depth of the etched area to the thickness of the second layer, and an optical density of a stack composed of the first layer and the second layer is 3 or greater.

According to an example embodiment, a method of manufacturing a mask may include: preparing the above-mentioned mask blank; forming a first thin film pattern by etching the second layer using a first resist pattern having an open phase shift area; forming a second thin film pattern by etching the first layer using the first thin film pattern as a mask; forming a phase shift pattern on a light transmitting substrate by etching portions of the first thin film pattern positioned on a phase non-shift area, along with an exposed region of the light transmitting substrate, using a second resist pattern having an open light transmitting region that includes the phase shift area and the phase non-shift area; and exposing portions of the light transmitting substrate by selectively etching portions of the second thin film pattern positioned on the phase non-shift area.

According to an example embodiment, a method of manufacturing a phase shift mask to be used for making patterns for a semiconductor device may include: providing a light transmitting substrate having a light transmitting region and a light blocking region, wherein the light transmitting region has an etched area having a predefined depth and a non-etched area; disposing a first layer on the light blocking region of the light transmitting substrate, the first layer including a material that contains chromium and at least one element selected from oxygen, nitrogen, and carbon and having a first thickness; disposing a second layer on the first layer as an outermost layer among the first layer and second layer, the second layer including a silicon compound that contains silicon and at least one element selected from oxygen, nitrogen, and carbon, an alloy of a transition metal and silicon, or a transition metal and silicon compound that contains a transition metal, silicon, and at least one element selected from oxygen, nitrogen, and carbon, and having a second thickness, dry etching the light transmitting substrate using a fluorine-based gas in a manner such that an etching selectivity of the light transmitting substrate with respect to the second layer is equal to or greater than a ratio of the predefined depth of the etched area to the second thickness of the second layer; and selecting a value for the first thickness of the first layer and a value for the second thickness of the second layer in a manner such that an optical density of a stack composed of the first layer and the second layer is 3 or greater.

BRIEF DESCRIPTION OF DRAWINGS

The above, and other aspects, features, and advantages of the present disclosure will be more clearly understood from the following detailed description when taken in conjunction with the accompanying drawings, in which.

DETAILED DESCRIPTION

Figure 1:
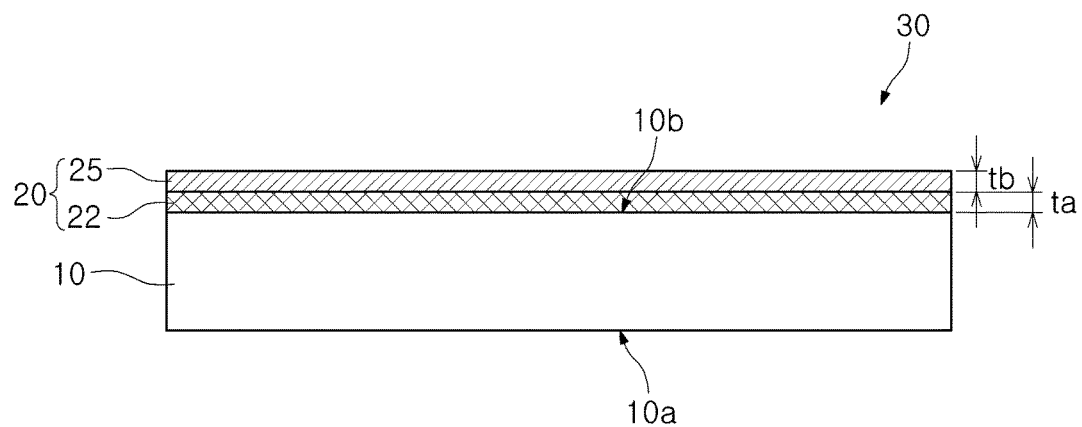
FIG. 1 is a cross-sectional view of a mask blank according to an example embodiment.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, like numbers refer to like elements throughout. Though the different figures show various features of exemplary embodiments, these figures and their features are not necessarily intended to be mutually exclusive from each other. Rather, certain features depicted and described in a particular figure may also be implemented with embodiment(s) depicted in different figure(s), even if such a combination is not separately illustrated. Referencing such features/figures with different embodiment labels (e.g. "first embodiment") should not be interpreted as indicating certain features of one embodiment are mutually exclusive of and are not intended to be used with another embodiment.

Unless the context indicates otherwise, the terms first, second, third, etc., are used as labels to distinguish one element, component, region, layer or section from another element, component, region, layer or section (that may or may not be similar). Thus, a first element, component, region, layer or section discussed below in one section of the specification (or claim) may be referred to as a second element, component, region, layer or section in another section of the specification (or another claim).

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Unless otherwise defined, all terms (including technical and scientific terms) used herein have the same meaning as commonly understood by one of ordinary skill consistent with their meaning in the context of the relevant art and/or the present application.

FIG. 1 is a cross-sectional view of a mask blank according to an example embodiment.

Referring to FIG. 1, a mask blank 30, according to an example embodiment, may include a light transmitting substrate 10 having a first surface 10a and a second surface 10b opposite to the first surface 10a, and a light blocking portion 20 disposed on the second surface 10b of the light transmitting substrate 10. The light blocking portion 20 may be etched. The light blocking portion 20 may include a stack composed of a first layer 22 and of a second layer 25. Each of the first layer 22 and the second layer 25 is also may be selectively etched.

The light transmitting substrate 10 may be composed of a material that may be patterned by a dry etching process, and having a light transmitting property. For example, the light transmitting substrate 10 may be a transparent, rigid material such as quartz or nonalkali glass.

The first layer 22 may include a material having a high etching selectivity, with respect to the light transmitting substrate 10, according to dry etching conditions. The first layer 22 may include a material having a high degree of etching resistance when being dry etched using a fluorine-based gas, for example, $HF_3$ or $CF_4$. The etching resistance of the material of the first layer 22 may be higher than that of the light transmitting substrate 10. For example, when dry etching is performed using a fluorine-based gas, an etching rate for the first layer 22 may be lower than an etching rate of the light transmitting substrate 10. In some embodiments, lateral etching of the first layer 22 may be significantly reduced when the light transmitting substrate 10 is etched (refer to FIG. 10).

Further, the first layer 22 may have a lower degree of etching resistance (i.e., a higher etching rate) than that of the light transmitting substrate 10 when the light transmitting substrate 10 is dry etched using a mixture of a chlorine-based gas, for example, $Cl_2$, and an oxygen-based gas. In some embodiments, a portion of the first layer 22 may be removed from a phase non-shift area S1 of the light transmitting substrate 10 without a separate resist mask (refer to FIG. 11).

In order to satisfy such an etching selectivity, the first layer 22 may be composed of a material that contains at least chromium (Cr). The material containing Cr may be effectively etched by a mixture of a chlorine-based gas and an oxygen-based gas while having a high degree of etching resistance when being dry etched, using a fluorine-based gas.

For example, the first layer 22 may include only chromium element, or a chromium compound that contains chromium and at least one element selected from oxygen, nitrogen, and carbon. For example, the chromium compound may be any of or a combination of a chromium oxide (CrO), a chromium nitride (CrN), a chromium oxynitride (CrON), a chromium oxycarbide (CrCO), a chromium carbonitride (CrCN), or a chromium carboxynitride (CrCNO).

Etching bias may be proportionally related to the thickness of the chromium or the chromium compound forming the first layer 22. Thus, when the thickness of the chromium or the chromium compound forming the first layer 22 is comparatively large, etching bias may become larger, and thus, the critical dimension (CD) deviation of an etched pattern may be increased. According to the exemplary embodiments, the thickness ta of the first layer 22 as illustrated in FIG. 1 may be 45 nm or less in order to ensure accuracy of the etched pattern. For example, the thickness ta of the first layer 22 may range from about 5 nm to about 30 nm.

The second layer 25 employed in FIG. 1 may be disposed on the first layer 22 as an element forming the light blocking portion 20. The second layer 25 may be provided as an etching mask for patterning the first layer 22 as an outermost layer of the mask blank 30.

While the second layer 25 may have a high etching selectivity with respect to the first layer 22, the second layer 25 may have an etching tendency similar to that of the light transmitting substrate 10. For example, the second layer 25 and the light transmitting substrate 10 may be effectively etched by the same etching process.

Figure 8:
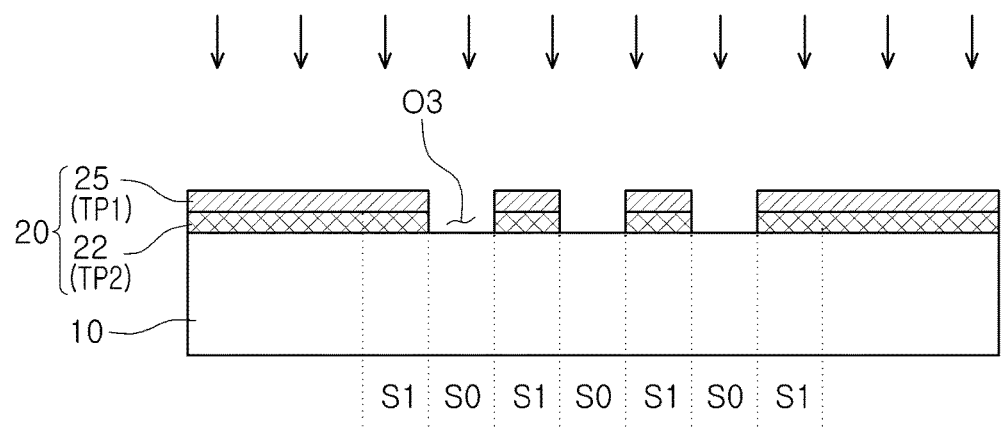

For example, the second layer 25 may have a lower degree of etching resistance than that of the first layer 22 when being dry etched, using a mixture of a chlorine-based gas and an oxygen-based gas, to thus be used as an etching mask for the first layer 22 (refer to FIG. 8). For example, when dry etching is performed using a mixture of a chlorine-based gas and an oxygen-based gas, an etching rate of the second layer 25 may be higher than an etching rate of the first layer 22.

Figure 10:
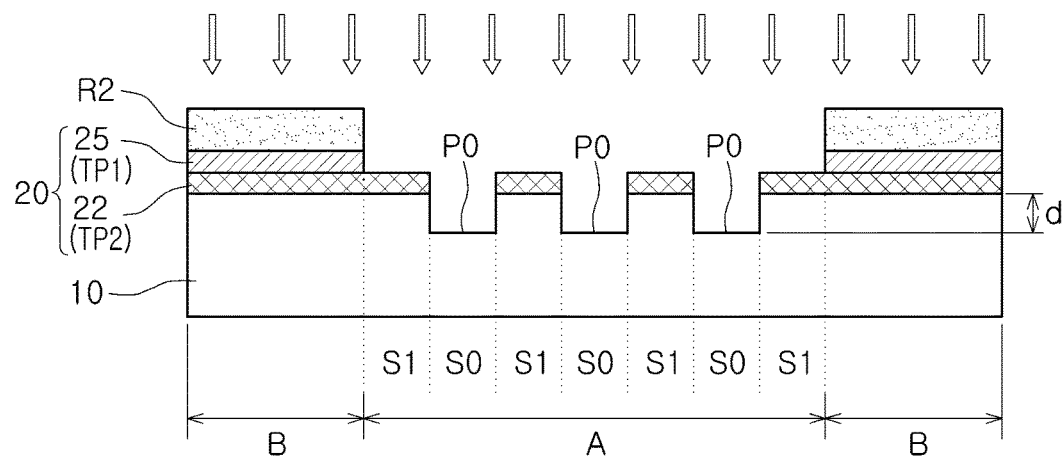

In some embodiments, the second layer 25 may be effectively etched similarly to the light transmitting substrate 10, when being dry etched using a fluorine-based gas (refer to FIG. 10).

In some embodiments, as described above, the first layer 22 may have a relatively high degree of etching resistance when being dry etched using a fluorine-based gas. Under such etching conditions, in a process of manufacturing a phase shift mask, a portion of the second layer 25 positioned in a light transmitting region (for example, a transfer area) may also be removed when the light transmitting substrate 10 is etched (refer to FIG. 10). The second layer 25 may be utilized as a criterion for determining an etching end point of the light transmitting substrate 10.

Thus, the etched depth of the light transmitting substrate 10 may be accurately adjusted without introducing an etching stop layer to the light transmitting substrate 10. This will be described later with reference to FIG. 12.

The composition of the second layer 25 may include, for example, a silicon compound that contains silicon and at least one element selected from oxygen, nitrogen, and carbon, an alloy of a transition metal and silicon, or a transition metal and silicon compound that contains a transition metal, silicon, and at least one element selected from oxygen, nitrogen, and carbon, but the disclosure is not limited thereto. In this exemplary embodiment, the transition metal may be one selected from titanium (Ti), vanadium (V), cobalt (Co), nickel (Ni), zirconium (Zr), niobium (Nb), molybdenum (Mo), hafnium (HF), and tantalum (Ta). For example, the second layer 25 may be a compound, for example, MoSiN, that contains silicon and a transition metal, such as molybdenum (Mo).

The second layer 25 may have a comparatively sufficient thickness tb such that the second layer 25 may be used as the etching mask for the first layer 22. For example, the thickness tb of the second layer 25 may be 3 nm or greater in one embodiment, or even 5 nm or greater in another embodiment. In an example embodiment, the thickness tb of the second layer 25 may range from about 10 nm to about 40 nm.

Referring to FIG. 1, the light blocking portion 20 may have the first and second layers 22 and 25 having the above-mentioned adjusted thicknesses ta and tb, respectively, to obtain a desired relatively very low degree of light transmittance, for example, a high optical density (OD). For example, when the first layer 22 includes chromium or a chromium compound and the second layer 25 includes a compound, for example, MoSiN, that contains silicon and a transition metal, such as molybdenum, the respective thicknesses ta and tb may be adjusted to obtain an optical density of 3 or greater. Conditions of the thicknesses ta and tb related to this will be described in detail with reference to FIG. 4.

Referring to FIG. 1, the mask blank 30 may be usefully employed as a phase shift mask, such as a Levenson mask, or a mask blank for a phase inversion mask.

Figure 2:
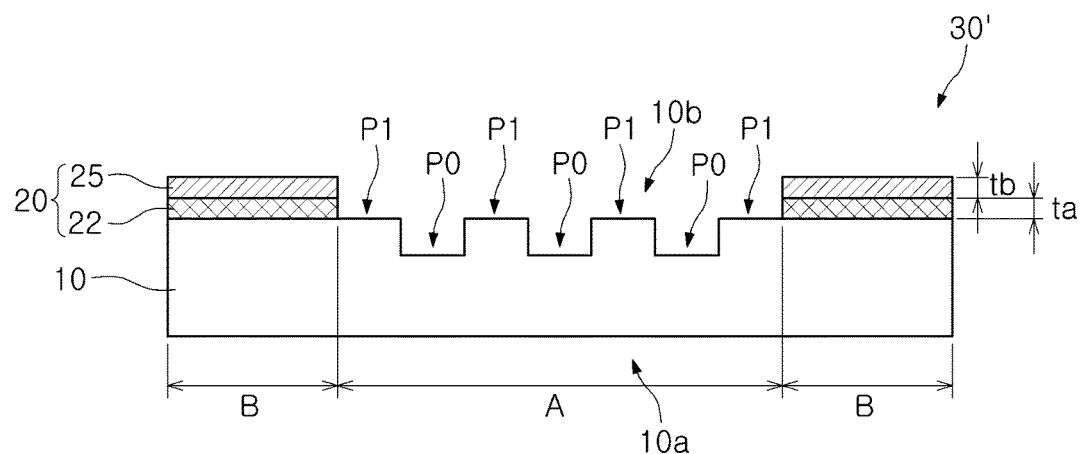
FIGS. 2 and 3 are a cross-sectional view and a plan view of a phase shift mask according to an example embodiment, respectively.
Figure 3:
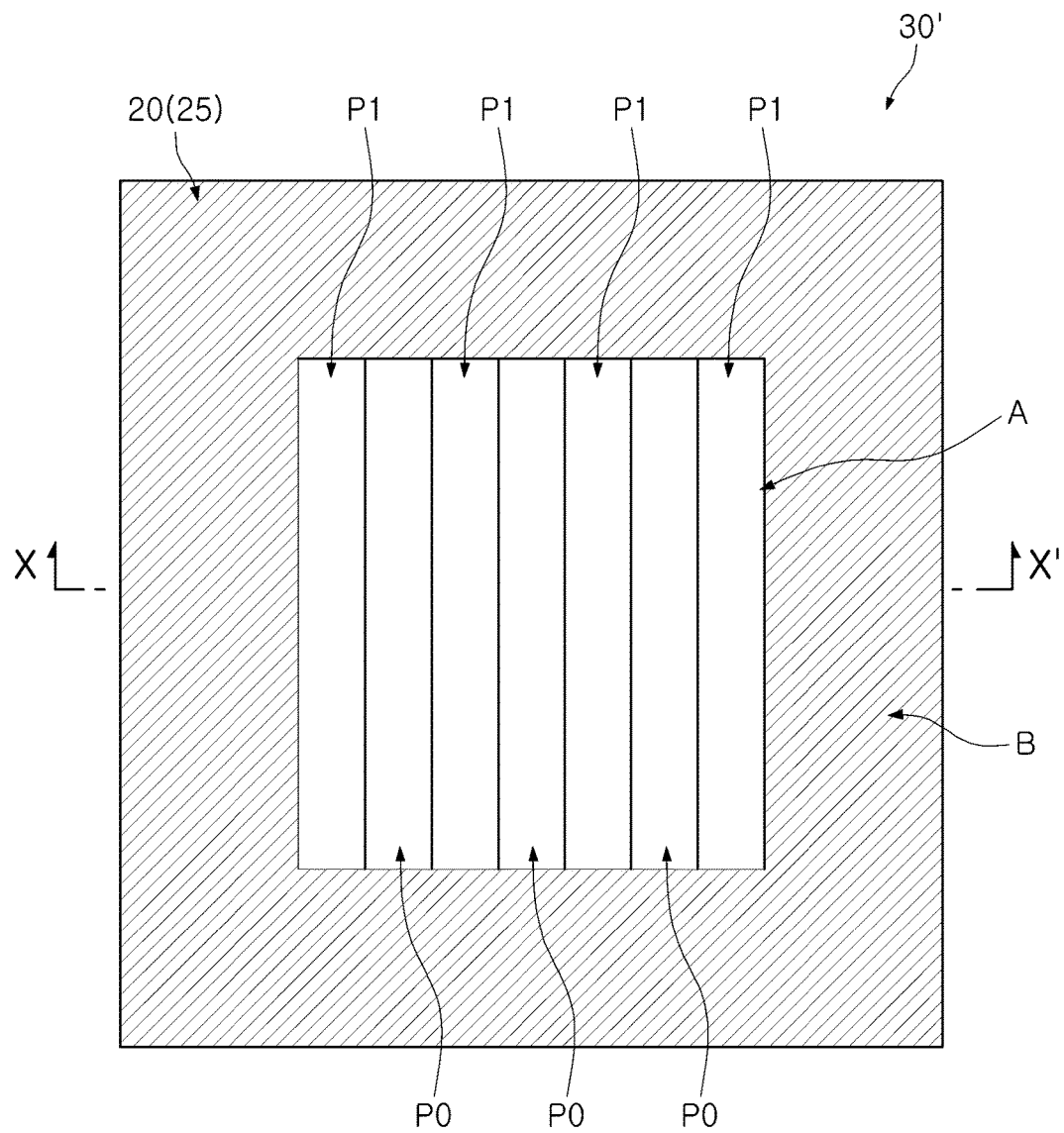

FIGS. 2 and 3 are a cross-sectional view and a plan view of a phase shift mask according to an example embodiment of the present inventive concept, respectively. A phase shift mask 30', illustrated in FIGS. 2 and 3, may be understood as a phase shift mask manufactured from the mask blank 30 illustrated in FIG. 1. The components of FIGS. 2 and 3, indicated by the same denotations as those of FIG. 1, may be understood as being equal or similar to those of FIG. 1 unless otherwise specified.

Referring to FIGS. 2 and 3, the phase shift mask 30', illustrated in FIG. 2, may include the light transmitting substrate 10 having a light transmitting region A and a light blocking region B, and the light blocking portion 20 disposed on the light blocking region B.

Referring to FIG. 2, the light blocking portion 20 may be disposed on the light blocking region B, positioned along an edge region of the light transmitting substrate 10, as illustrated in FIG. 3. As described above, the light blocking portion 20 may include the first layer 22 disposed on the light transmitting substrate 10, and the second layer 25 disposed on the first layer 22. For example, the first layer 22 may include chromium or a chromium compound, and the second layer 25 may include a compound, for example, MoSiN, that contains silicon and a transition metal such as molybdenum. Detailed descriptions of the first and second layers 22 and 25 may be illustrated by FIG. 1.

The light transmitting region A of the light transmitting substrate 10 may refer to a transfer area for transferring a desired pattern, and may include a non-etched area P1 and an etched area P0. As illustrated in FIGS. 2 and 3, the non-etched area P1 may provide a phase non-shift area S1, through which light passes without being phase shifted, and the etched area P0 may provide a phase shift area S0, through which light passes while being phase inverted. Such a phase inversion effect may be obtained by adjusting an etched depth d, along with the wavelength of light and the optical property of the light transmitting substrate 10, for example, a refractive index or the like.

The first layer 22 may include chromium or a chromium compound, and the second layer 25 may include a silicon compound that contains silicon and at least one element selected from oxygen, nitrogen, and carbon, an alloy of silicon and a transition metal, such as molybdenum, or a transition metal and silicon compound, for example, MoSiN, that contains a transition metal and silicon.

Figure 4:
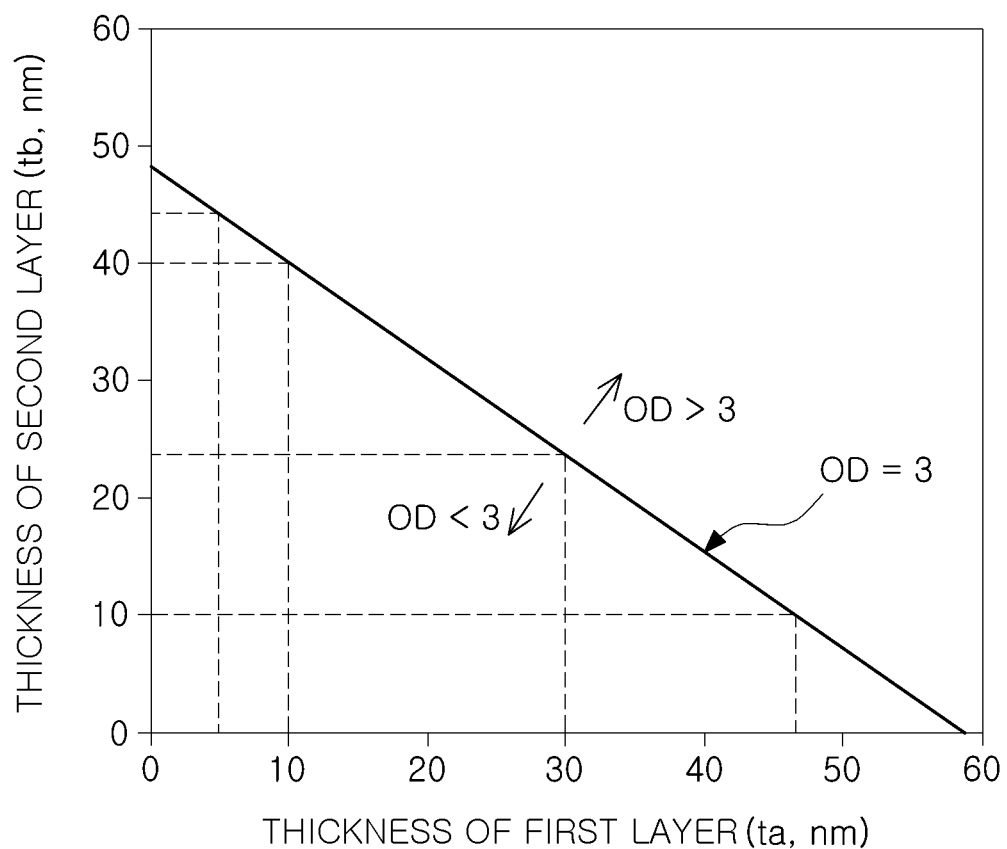
FIG. 4 is a graph of optical densities (OD) depending on changes in the thicknesses of a first layer and a second layer.

By adjusting the thicknesses ta and tb of the first and second layers 22 and 25, the light blocking portion 20 may have an optical density (OD) of 3 or greater. FIG. 4 is a graph illustrating conditions of the thicknesses ta and tb of the first and second layers 22 and 25 that yield an optical density of 3 or greater.

The graph in FIG. 4 illustrates results obtained from an example in which the first layer 22 includes CrCO having a dielectric constant of 1.815, and the second layer 25 includes MoSiN having a dielectric constant of 2.19. For example, when the thickness ta of the first layer 22 is 50 nm, and the thickness tb of the second layer 25 is about 7 nm or greater, an optical density of 3 or greater may be obtained, and thus, a sufficient light blocking effect may be provided. As illustrated in FIG. 4, the thicknesses ta and tb of the first and second layers 22 and 25 may be set such that the OD may be 3 or greater.

In some example embodiments, as described above, when the thickness ta of the first layer 22 is comparatively large, etching bias may be increased, and thus, the first layer 22 may have a thickness of 45 nm or less. In order for the optical density of the light blocking portion 20 to be 3 or greater, the thickness tb of the second layer 25 may be 10 nm or greater.

In some example embodiments, in order to reliably protect the light transmitting substrate 10 when the second layer 25 is patterned, the first layer 22 may have a thickness of 5 nm or greater. In order for the optical density of the light blocking portion 20 to be 3 or greater, the thickness tb of the second layer 25 may be 45 nm or greater.

In some example embodiments, in order to use a resist having a relatively reduced thickness, for example, 800 Å or less, when the second layer 25 is etched to be patterned, the thickness tb of the second layer 25 may be set to be 40 nm or less. In order for the optical density of the light blocking portion 20 to be 3 or greater, the thickness ta of the first layer 22 may be 10 nm or greater.

In order to obtain an optical density of 3 or greater, the thickness ta of the first layer 22 may substantially be in inverse proportion to the thickness tb of the second layer 25, and thus, the first and second layers 22 and 25 may be set to have proper thicknesses with consideration of other design factors, for example, a critical dimension deviation or the like.

In an example embodiment, the thickness tb of the second layer 25 may range from 10 nm to 40 nm, and the thickness ta of the first layer 22 may be accordingly selected such that the optical density may be 3 or greater.

In another detailed example embodiment, to achieve CD quality, the thickness ta of the first layer 22 may be set to be 30 nm or less, and the thickness tb of the second layer 25 may be accordingly selected such that the optical density may be 3 or greater. For example, the thickness ta of the first layer 22 may range from 5 nm to 30 nm, and the thickness tb of the second layer 25 may range from 25 nm to 45 nm. For example, when the thickness ta of the first layer 22 is about 5 nm, the thickness tb of the second layer 25 may be about 45 nm, when the thickness ta of the first layer 22 is about 10 nm, the thickness tb of the second layer 25 may be about 40 nm, and when the thickness ta of the first layer 22 is 30 nm, the thickness tb of the second layer 25 may be about 25 nm. As such, the thickness of the first layer 22 may be inversely proportional and linearly related to the thickness of the second layer 25.

The phase shift mask 30', according to FIG. 4, may be referred to as a reticle used in a photolithography process.

The light blocking portion 20 employed in FIG. 4 may be disposed only in the edge region of the light transmitting substrate 10, as illustrated in FIG. 3, but the light transmitting region A may also have a region in which light needs to be blocked. For example, a portion of the light blocking portion 20 may also be disposed between the phase shift area S1 and the phase non-shift area S0, while being compact.

FIGS. 5 through 11 are cross-sectional views illustrating a method of manufacturing a phase shift mask according to an example embodiment of the present inventive concept. The illustrated manufacturing method may be referred to as a method of manufacturing the phase shift mask 30' illustrated in FIG. 2, using the mask blank 30 illustrated in FIG. 1.

Figure 5:
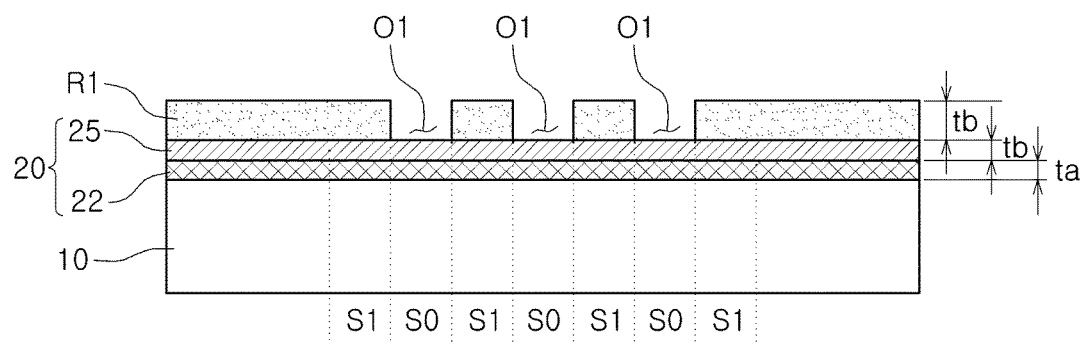
FIGS. 5 through 11 are cross-sectional views illustrating a method of manufacturing a phase shift mask according to an example embodiment.

Referring to FIG. 5, a first resist pattern R1 having a first opening O1, in which the phase shift area S0 is open, may be formed on the mask blank 30.

The first resist pattern R1 may be formed by coating a resist material on the second layer 25, and then developing the resist material so as to have the first opening O1. A portion of the second layer 25, positioned in the phase shift area S0, may be exposed through the first opening O1. The thickness tc of the first resist pattern R1 may be set in consideration of the thickness tb of the first layer 22 to be etched. For example, the thickness tc of the first resist pattern R1 may be 100 nm or less in one embodiment and 80 nm or less in another embodiment.

Figure 6:
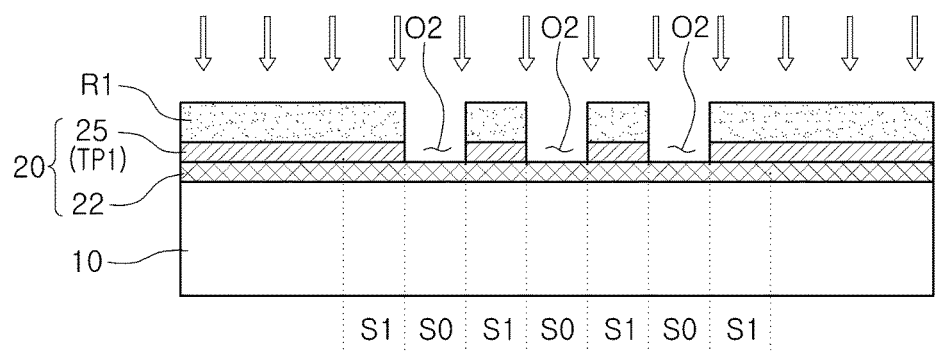

Referring to FIG. 6, a first thin film pattern TP1 having a second opening O2 may be formed by etching a portion of the second layer 25, using the first resist pattern R1.

In this process, the first resist pattern R1 may be used as a mask. The etching of the portion of the second layer 25 may be performed by a dry etching process using a fluorine-based gas. A fluorine-based gas used in such a dry etching process may include, for example, at least one of $CHF_3$, $CF_4$, $C_2F_6$, $C_4F_8$, and $SF_6$. As described above, when the portion of the second layer 25 is dry etched using the fluorine-based gas, the second layer 25 may have a high etching selectivity with respect to the first layer 22, and thus, the first thin film pattern TP1, having a second opening O2, in which a portion of the first layer 22 is open, may be formed.

Figure 7:
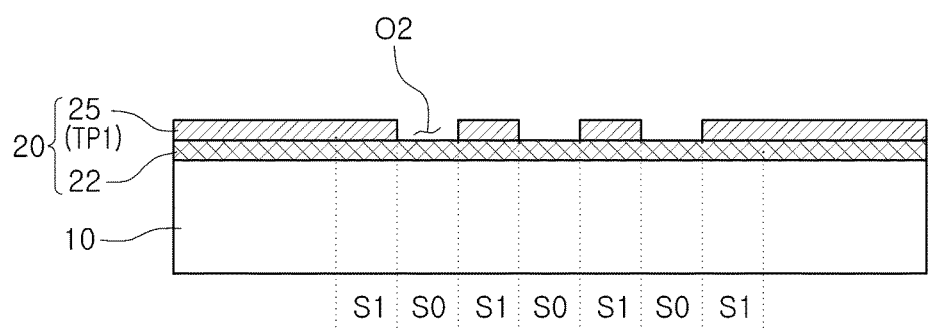

Referring to FIG. 7, the remainder of the first resist pattern R1 may be removed from an upper surface of the first thin film pattern TP1. This process may be performed using a stripping composition for removal of a photoresist. For example, such a stripping composition may include an amine compound, a protogenic polar solvent, or a non-protogenic polar solvent.

Referring to FIG. 8, a second thin film pattern TP2 may be formed by etching a portion of the first layer 22, using the first thin film pattern TP1 as a mask.

This etching process of etching a portion of the first layer 22 may be performed by a dry etching process, using a mixture of a chlorine-based gas and an oxygen-based gas. For example, a chlorine-based gas used in the dry etching process may include at least one of $Cl_2$, $SiCl_4$, $CHCl_3$, $CH_2Cl_2$, $CCl_4$, and $BCl_3$. When dry etched using the mixture of the chlorine-based gas and the oxygen-based gas, the first layer 22 may have a high etching selectivity with respect to the light transmitting substrate 10, as well as to the second layer 25. Thus, the second thin film pattern TP2, having a third opening O3, in which the phase shift area S0 of the light transmitting substrate 10 is open, may be formed, and the first thin film pattern TP1 may remain, substantially, on the second thin film pattern TP2 as is.

Figure 9:
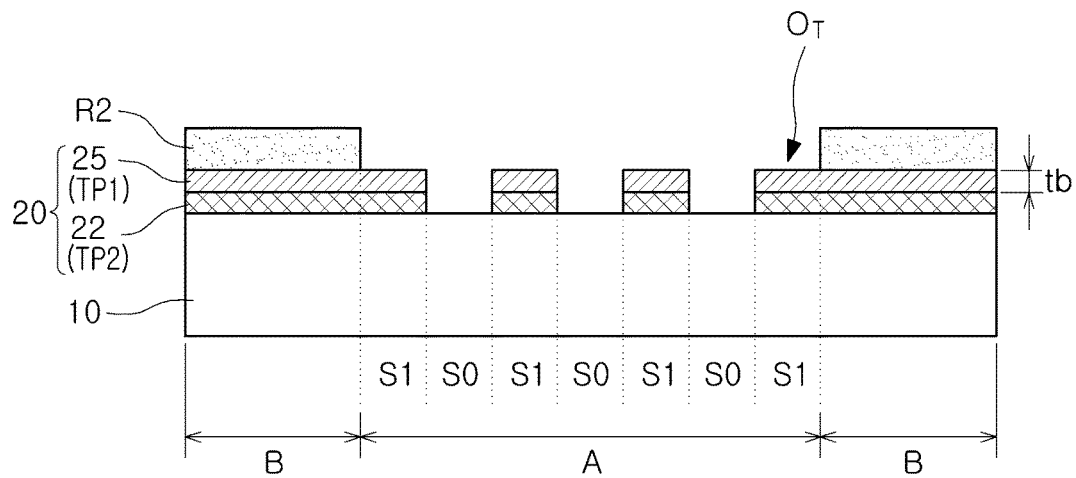

Referring to FIG. 9, a second resist pattern R2, having an opening $O_T$, in which the light blocking region B of the mask blank 30 is open, may be formed.

For example, the second resist pattern R2 may be formed in this process, such that a portion of the second layer 25, positioned in the phase non-shift area S1, may be open along with a portion of the light transmitting substrate 10 corresponding to the phase shift area S0. In a subsequent etching process, the portion of the light transmitting substrate 10, corresponding to the phase shift area S0 and the portion of the second layer 25 positioned in the phase non-shift area S1, may be exposed together.

Referring to FIG. 10, a dry etching process may be performed using the second resist pattern R2 formed in FIG. 9.

The second layer 25 and the light transmitting substrate 10 illustrated in FIG. 10 may have an etching tendency similar to each other, and thus, the portion of the second layer 25, positioned in the phase non-shift area S1, may be effectively etched in the dry etching process using a fluorine-based gas to form the etched area P0 in the phase shift area S0. Thus, in this dry etching process, when an etched pattern P0, etched to a certain depth d from the surface of an exposed phase shift area S0 of the light transmitting substrate 10, is formed, the portion of the second layer 25 positioned on the phase non-shift area S1, for example, a portion of the first thin film pattern TP1, may substantially be removed.

In the dry etching process, when the light transmitting substrate 10 is dry etched, the portion of the second layer 25 positioned in the light transmitting region A, for example, the transfer area, may also be removed. Thus, the portion of the second layer 25 may be utilized as a criterion for determining an etching end point of the light transmitting substrate 10. Using an end point detection (EPD) method, detecting a certain component during the dry etching process, an etched depth d required for the phase inversion may be accurately controlled. For example, the light transmitting substrate 10 and the second layer 25 may commonly contain a certain component, for example, silicon, and the certain component may be detected when the light transmitting substrate 10 and the second layer 25 are dry etched. For example, the light transmitting substrate 10 may be a quartz substrate, and the second layer 25 may include a nitride, for example, MoSiN, that contains molybdenum and silicon.

Figure 12:
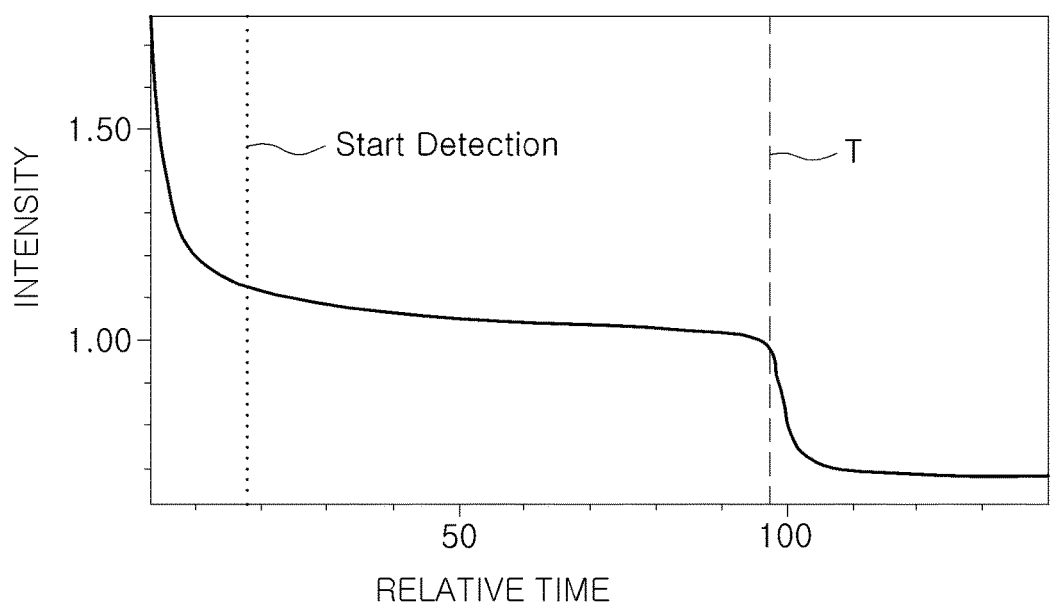
FIG. 12 is a graph illustrating an etched depth control method employed in an example embodiment of the present inventive concept.

FIG. 12 is a graph of EPD detection results for illustrating an etched depth control method employed in an example embodiment of the present inventive concept. A result of the detection of a silicon component during the dry etching process illustrated in FIG. 10 may be seen in FIG. 12.

Referring to FIG. 12, it can be seen that when the detection is started, a large amount of silicon components are detected (etching the second layer 25 and the light transmitting substrate 10), and that a detected amount of silicon components is rapidly reduced at a certain point of time T. Such a reduction may occur since the portion of the first layer 22, exposed after the removal of the portion of the second layer 25, may not be removed using a dry etching process using a fluorine-based gas. Thus, the point of time T may be referred to as a point of time when the portion of the second layer 25, positioned in the phase non-shift area S1, has been substantially removed.

A desired etched depth d may be accurately controlled by setting an etching time for forming the phase shift area S0, based on a point of time T when the etching of the portion of the second layer 25 is finished. For example, the light transmitting substrate 10 may be accurately etched to a desired depth d by being etched at a point of time T when the portion of the second layer 25 has been substantially removed, or by being continuously etched for a certain period of time after the point of time T. The desired etched depth d may be determined as a thickness required for the phase inversion, and the etching time for obtaining the desired etched depth d may be set to the dry etching process conditions. Here, conditions of the second layer 25, for example, a component or thickness, may be determined such that the portion of the second layer 25 may be completely etched for a period of time shorter than or equal to the etching time.

For example, in order for the portion of the second layer 25 to be utilized as an etching end point of the phase shift area S0, when the portion of the second layer 25 is dry etched using a fluorine-based gas, the etching selectivity of the second layer 25 with respect to the light transmitting substrate 10 may be equal to or greater than the ratio of the thickness tb of the second layer 25 to the etched depth d of the etched area P0. For example, when the portion of the second layer 25 is dry etched using a fluorine-based gas, and when the etching selectivity of the second layer 25 with respect to the light transmitting substrate 10 is 1.5 (i.e., 1.5:1), the ratio of the thickness tb of the second layer 25 to the etched depth d may be set to be 1.5:1 or greater, for example, 2:1.

The etched depth d of the phase shift area S0 may be accurately controlled without employing a separate etching stop layer in the light transmitting substrate 10. For example, in this example embodiment, the light transmitting substrate 10 may be a substrate including a substantially uniform component system in the entire region thereof without having an etching stop layer formed of another material.

Figure 11:
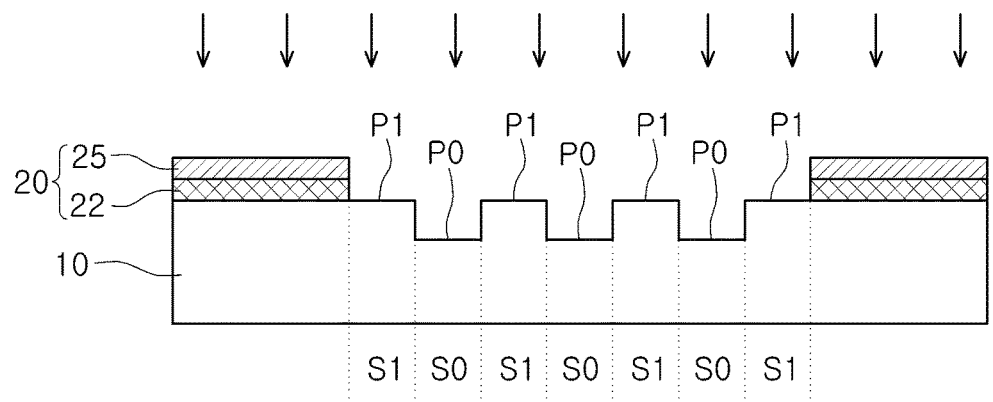

Referring to FIG. 11, a portion of the light transmitting substrate 10 may be exposed by selectively etching a portion of the second thin film pattern TP2, positioned on the phase non-shift area S1, that is, a portion of the first layer 22.

This etching process may be performed by using a dry etching process using a mixture of a chlorine-based gas and an oxygen-based gas, and the portion of the first layer 22, positioned in the phase non-shift area S1, may be removed by the etching selectivity without damage to the light transmitting substrate 10. This process may be performed before or after the removal of the second resist pattern R2.

Figure 13A:
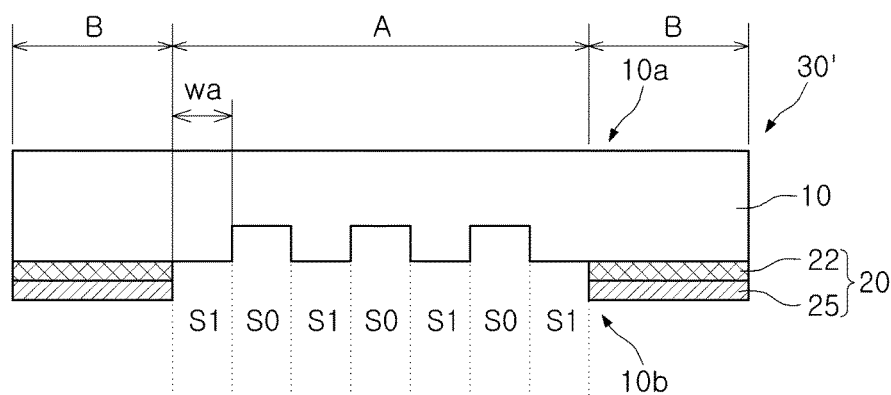
FIG. 13A is a cross-sectional view illustrating a photolithography process using a phase shift mask according to an example embodiment.
Figure 13B:
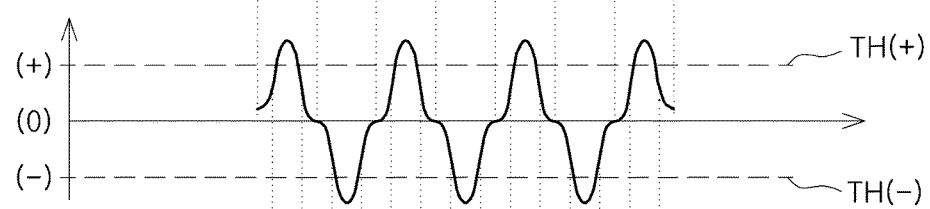
FIG. 13B is a graph illustrating a photolithography process using a phase shift mask according to an example embodiment.
Figure 13C:
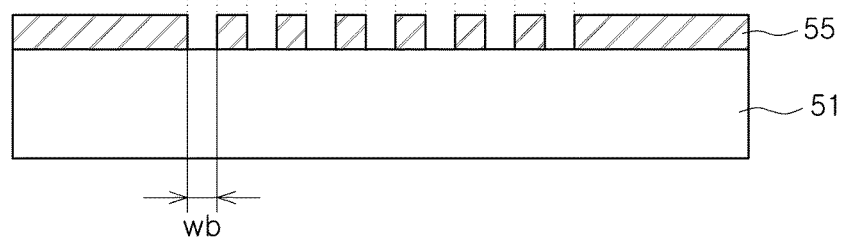
FIG. 13C is a cross-sectional view illustrating a photolithography process using a phase shift mask according to an example embodiment.

FIG. 13A is a cross-sectional view illustrating a photolithography process using a phase shift mask according to an example embodiment of the present inventive concept. FIG. 13B is a graph illustrating a photolithography process using a phase shift mask according to an example embodiment of the present inventive concept. FIG. 13C is a cross-sectional view illustrating a photolithography process using a phase shift mask according to an example embodiment of the present inventive concept.

FIG. 13A is a cross-sectional view of the phase shift mask illustrated in FIG. 2, and FIG. 13B is a graph illustrating the intensity of light passing through the phase shift mask illustrated in FIG. 13A. FIG. 13C is a cross-sectional view of a workpiece having a resist pattern.

Referring to FIGS. 13A and 13B, light, for example, an ultraviolet ray, radiated to the first surface 10a of the phase shift mask 30', may be transmitted through the light transmitting region A without being allowed to pass through by the light blocking portion 20 in the light blocking region B.

In the light transmitting region A, the phase shift area S0 and the phase non-shift area S1, formed by selectively etching the second surface 10b of the phase shift mask 30', may be arranged adjacent to each other.

As illustrated in FIG. 13B, light passing through the phase non-shift area S1 may penetrate therethrough in an original phase thereof, while light passing through the phase shift area S0 may be inverted. The light that has passed through may be transferred to a photoresist provided on a workpiece S1, such as a semiconductor substrate of a semiconductor device, and after the photoresist is developed, a photoresist pattern 55, illustrated in FIG. 13C, may be obtained. The photoresist pattern could be used with a known subsequent photolithography process to etch patterns on the semiconductor substrate.

As used herein, a semiconductor device may refer to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

In some embodiments, a portion of the exposed photoresist, radiated with light having a threshold intensity TH or greater, may be removed in the development of the photoresist, and may form a desired photoresist pattern 55 (which is an example of a positive photoresist process).

In such a process, light interference in a region between two adjacent patterns, for example, between the adjacent phase shift area S0 and phase non-shift area S1, may be offset without being amplified by a phase difference. Thus, the phase shift mask 30' may prevent the intensity of light passing through the light transmitting region A, in the region between the two adjacent patterns, from being increased to an intensity close to the threshold intensity.

As a result, the photoresist pattern 55, having a line width wb narrower than the pattern width wa of the phase shift mask 30', may be precisely implemented. As a result, an exposure device may be realized, with high accuracy, to have a resolution less than a threshold resolution (TH).

As set forth above, according to example embodiments of the present inventive concept, the above-mentioned mask blank may simplify a manufacturing process thereof and guarantee a high degree of light blocking property, for example, a high optical density (OD).

A phase shift mask manufactured using a mask blank, according to example embodiments of the present inventive concept, may simplify a pattern forming process of the phase shift mask. The mask blank and the phase shift mask may guarantee a low critical dimension (CD) deviation, and may accurately control an etched depth of an etched area.

While exemplary embodiments have been shown and described above, it will be apparent to those skilled in the art that modifications and variations could be made without departing from the scope of the present inventive concept as defined by the appended claims.

What is claimed is:

1. A mask blank comprising:
   a light transmitting substrate;
   a first layer disposed on the light transmitting substrate, and including a chromium compound that contains chromium and at least one element selected from oxygen, nitrogen, and carbon; and
   a second layer disposed on the first layer as an outermost layer, and including a nitride that contains molybdenum and silicon,
   wherein an optical density (OD) of a stack composed of the first layer and the second layer is 3 or greater.

2. The mask blank of claim 1,
   wherein the thickness of the first layer is 45 nm or less, and the thickness of the second layer is 5 nm or greater.

3. The mask blank of claim 2,
   wherein the thickness of the first layer is about 30 nm or less, and the thickness of the second layer is a value ranging from about 10 nm to about 40 nm.

4. The mask blank of claim 1,
   wherein the second layer comprises a material having characteristics of being dry etched along with the light transmitting substrate.

5. The mask blank of claim 1,
   wherein the second layer and the light transmitting substrate comprise at least one element in common.

6. The mask blank of claim 1,
   wherein the light transmitting substrate does not comprise an etching stop layer having an etching selectivity with respect to the light transmitting substrate.

7. The mask blank of claim 1,
   wherein the light transmitting substrate is a quartz substrate, and the first layer is composed of material selected from a chromium nitride (CrN), a chromium oxynitride (CrON), and a chromium oxycarbide (CrCO).

* * * * *